(12) United States Patent
Chang et al.

(10) Patent No.: US 10,880,990 B2
(45) Date of Patent: Dec. 29, 2020

(54) THREE LAYER FORCE PAD

(71) Applicant: Synaptics Incorporated, San Jose, CA (US)

(72) Inventors: Yi-Yun Chang, Taipei (TW); Tzeng-Fu Kao, Taipei (TW)

(73) Assignee: Synaptics Incorporated, San Jose, CA (US)

(*) Notice: Subject to any disclaimer, the term of this patent is extended or adjusted under 35 U.S.C. 154(b) by 192 days.

(21) Appl. No.: 16/189,490

(22) Filed: Nov. 13, 2018

(65) Prior Publication Data

US 2020/0154560 A1 May 14, 2020

(51) Int. Cl.
| | |
|---|---|
| *H05K 1/02* | (2006.01) |
| *G01L 1/14* | (2006.01) |
| *G01L 1/20* | (2006.01) |
| *G06F 3/041* | (2006.01) |

(52) U.S. Cl.
CPC ............ *H05K 1/0213* (2013.01); *G01L 1/146* (2013.01); *G01L 1/20* (2013.01); *G06F 3/0414* (2013.01)

(58) Field of Classification Search
CPC ......... H05K 1/0213; G01L 1/146; G01L 1/20; G06F 3/0414
See application file for complete search history.

(56) References Cited

U.S. PATENT DOCUMENTS

| | | | | |
|---|---|---|---|---|
| 10,592,057 | B1* | 3/2020 | Tan | H03K 17/962 |
| 2015/0084909 | A1* | 3/2015 | Worfolk | G06F 3/0414 |
| | | | | 345/174 |
| 2017/0300166 | A1* | 10/2017 | Rosenberg | G06F 3/0416 |
| 2018/0095582 | A1* | 4/2018 | Hwang | H01L 27/3276 |
| 2018/0146314 | A1* | 5/2018 | Rosener | H04R 1/1041 |
| 2018/0299997 | A1* | 10/2018 | Isaacson | G06F 3/045 |
| 2019/0339776 | A1* | 11/2019 | Rosenberg | G06F 3/047 |

* cited by examiner

*Primary Examiner* — Jonathan M Dunlap
(74) *Attorney, Agent, or Firm* — Ferguson Braswell Fraser Kubasta PC (57) ABSTRACT

A force pad sensor includes a face sheet including a force sensing resister, and a printed circuit board assembly. The printed circuit board assembly includes a proximity sensor layer including a proximity receiver electrode and a proximity transmitter electrode, and a force sensor layer including a force receiver electrode and a force transmitter electrode. The force receiver electrode and the FSR intersect a same vertical plane, the vertical plane being perpendicular to the face sheet.

20 Claims, 7 Drawing Sheets

THREE LAYER FORCE PAD

FIELD

This invention generally relates to electronic devices.

BACKGROUND

Force pad devices include both proximity and force detection and are widely used in a variety of electronic systems. A force pad may include a sensing region, often demarked by a surface. In the sensing region, the force pad determines the presence, location, motion, and/or force of one or more input objects. Force pads may be used to provide interfaces for the electronic system. For example, a force pad may be used for larger computing systems (e.g., opaque touchpads integrated in, or peripheral to, notebook or desktop computers).

SUMMARY

In general, in one aspect, one or more embodiments relate to a force pad sensor that includes a face sheet including a force sensing resister, and a printed circuit board assembly. The printed circuit board assembly includes a proximity sensor layer including a proximity receiver electrode and a proximity transmitter electrode, and a force sensor layer including a force receiver electrode and a force transmitter electrode. The force receiver electrode and the FSR intersect a same vertical plane, the vertical plane being perpendicular to the face sheet.

In general, in one aspect, one or more embodiments relate to a force pad. The force pad includes a face sheet, a proximity sensor layer, and a force sensor layer. The face sheet includes a mylar layer, and conductive ink and a force sensing resister (FSR) printed on the mylar layer. The proximity sensor layer includes a proximity receiver electrode, a proximity transmitter electrode, and a floating electrode. The force sensor layer includes a force receiver electrode and a force transmitter electrode. The force receiver electrode, the FSR, and the floating electrode intersect a same vertical plane, the vertical plane being perpendicular to the face sheet.

In general, in one aspect, one or more embodiments relate to a method. The method includes printing, on a mylar layer, conductive ink and a force sensing resistor, and affixing, using an adhesive material, a printed circuit board assembly (PCBA) to the mylar layer. The PCBA includes a proximity sensor layer including a proximity receiver electrode and a proximity transmitter electrode, and a force sensor layer including a force receiver electrode and a transmitter electrode. The force receiver electrode and the FSR intersect a same vertical plane, the vertical plane being perpendicular to the face sheet.

Other aspects of the invention will be apparent from the following description and the appended claims.

BRIEF DESCRIPTION OF DRAWINGS

Exemplary embodiments will be described in conjunction with the appended drawings, where like designations denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

In the following detailed description of embodiments, numerous specific details are set forth in order to provide a more thorough understanding of the disclosed technology. However, it will be apparent to one of ordinary skill in the art that the disclosed technology may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

Various embodiments of the present invention provide force pads and methods that facilitate improved usability while satisfying thickness constraints on the force pad. In particular, one or more embodiments is directed to force pad having a force sensing layer with a force receiver electrode in a same vertical plane as a force sensing resistor on a face sheet. The combination allows for a thin force pad design that is accurate.

Figure 1:
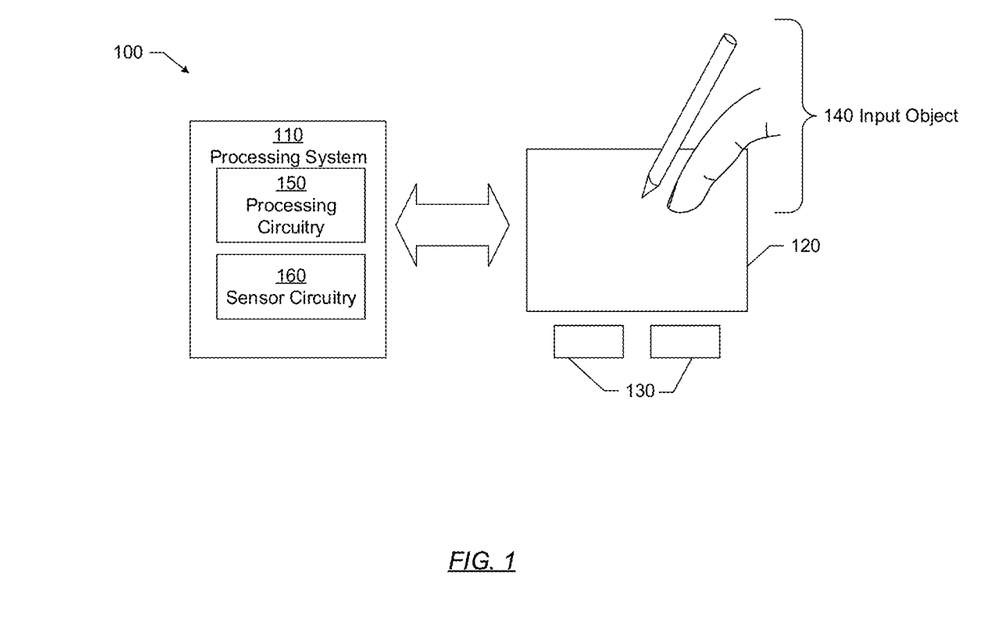
FIG. 1 is a block diagram of an example system that includes a force pad in accordance with an embodiment of the disclosure.

Turning now to the figures, FIG. 1 shows a block diagram of an exemplary force pad (100), in accordance with embodiments of the disclosure. The force pad (100) may be configured to provide input to an electronic system (not shown for simplicity). As used in this document, the term "electronic system" (or "electronic device") broadly refers to any system capable of electronically processing information. Examples of electronic systems may include personal computers of all sizes and shapes (e.g., desktop computers, laptop computers, netbook computers, tablets, web browsers, e-book readers, and personal digital assistants (PDAs)), composite input devices (e.g., physical keyboards, joysticks, and key switches), data input devices (e.g., remote controls and mice), data output devices (e.g., display screens and printers), remote terminals, kiosks, video game machines (e.g., video game consoles, portable gaming devices, and the like), communication devices (e.g., cellular phones, such as smart phones), and media devices (e.g., recorders, editors, and players such as televisions, set-top boxes, music players, digital photo frames, and digital cameras). Additionally, the electronic system could be a host or a slave to the force pad.

The force pad (100) may be implemented as a physical part of the electronic system. In the alternative, the force pad (100) may be physically separate from the electronic system. The force pad (100) may be coupled to (and communicate with) components of the electronic system using various wired or wireless interconnections and communication technologies, such as buses and networks. Example technologies may include Inter-Integrated Circuit (I2C), Serial Peripheral Interface (SPI), PS/2, Universal Serial Bus (USB), Bluetooth®, Infrared Data Association (IrDA), and various radio frequency (RF) communication protocols defined by the IEEE 802.11 or other standards.

The force pad (100) includes functionality to perform proximity and force detection. Force detection is the ability to detect an amount of force applied to an input surface. Proximity detection is the ability to sense input provided by one or more input objects (140) in a sensing region (120). Example input objects include fingers and styli. The sensing region (120) may encompass any space above, around, in and/or near the force pad (100) in which the force pad (100) is able to detect user input (e.g., provided by one or more input objects (140)). The sizes, shapes, and locations of particular sensing regions may vary depending on actual implementations.

In some embodiments, the sensing region (120) extends from a surface of the force pad (100) in one or more directions into space, for example, until a signal-to-noise ratio falls below a threshold suitable for object detection. For example, the distance to which this sensing region (120) extends in a particular direction, in various embodiments, may be on the order of less than a millimeter, millimeters, centimeters, or more, and may vary with the type of sensing technology used and/or the accuracy desired. In some embodiments, the force pad (100) detects inputs involving no physical contact with any surfaces of the force pad (100), contact with an input surface (i.e., a touch surface) of the force pad (100), contact with an input surface of the force pad (100) coupled with some amount of applied force or pressure, and/or a combination thereof.

In various embodiments, input surfaces may be provided by surfaces of a housing of the force pad (100) within which the sensor electrodes reside, by one or more face sheets applied over the sensor electrodes or any casings, etc. In some embodiments, the sensing region (120) has a rectangular shape when projected onto an input surface of the force pad (100).

The force pad (100) uses transcapacitance (Also referred to as "transcapacitance") sensing technologies. Transcapacitance sensing methods detect changes in the capacitive coupling between sensor electrodes. For example, an input object or ground near the sensor electrodes may alter the electric field between the sensor electrodes, thus changing the measured capacitive coupling of the sensor electrodes. In some embodiments, the force pad (100) may implement transcapacitance sensing by detecting the capacitive coupling between one or more transmitter sensor electrodes (also "transmitter electrodes" or "transmitter") and one or more receiver sensor electrodes (also "receiver electrodes" or "receiver"). Signals on the transmitter sensor electrodes may be modulated relative to a reference voltage (e.g., system ground) to transmit transmitter signals while receiver sensor electrodes may be held at a substantially constant voltage relative to the reference voltage to receive resulting signals. The reference voltage may be a substantially constant voltage or may be system ground. The resulting signal may be affected by environmental interference (e.g., other electromagnetic signals) as well as input objects or ground in contact with, or in close proximity to, the sensor electrodes.

The processing system (110) may be configured to operate the hardware of the force pad (100) to detect input in the sensing region (120). The processing system (110) may include parts of, or all of, one or more integrated circuits (ICs) and/or other circuitry components. For example, a processing system for a mutual capacitance sensor device may include transmitter circuitry configured to transmit signals with transmitter sensor electrodes, and/or receiver circuitry configured to receive signals with receiver sensor electrodes.

In some embodiments, the processing system (110) also includes electronically-readable instructions, such as firmware code, software code, and/or the like. In some embodiments, components composing the processing system (110) are located together, such as near sensing element(s) of the force pad (100). In other embodiments, components of processing system (110) are physically separate with one or more components close to the sensing element(s) of the force pad (100), and one or more components elsewhere. For example, the force pad (100) may be a peripheral coupled to a computing device, and the processing system (110) may include software configured to run on a central processing unit of the computing device and one or more ICs (perhaps with associated firmware) separate from the central processing unit. As another example, the force pad (100) may be physically integrated in a mobile device, and the processing system (110) may include circuits and firmware that are part of a main processor of the mobile device. In some embodiments, the processing system (110) is dedicated to implementing the force pad (100). In other embodiments, the processing system (110) also performs other functions, such as operating display screens, driving haptic actuators, etc. In some embodiments, the processing system (110) may include processing circuitry (150) configured to determine when at least one input object is in a sensing region, determine signal to noise ratio, determine positional information of an input object, determine force applied to the input surface, identify a gesture, determine an action to perform based on the gesture, a combination of gestures or other information, and/or perform other operations. In some embodiments, the processing system (110) may include sensor circuitry (160) configured to drive the sensing elements to transmit transmitter signals and receive the resulting signals. In some embodiments, the sensor circuitry (160) may include sensory circuitry that is coupled to the sensing elements. The sensory circuitry may include, for example, a transmitter module including transmitter circuitry that is coupled to a transmitting portion of the sensing elements and a receiver module including receiver circuitry coupled to a receiving portion of the sensing elements. The receiver circuitry is configured to receive capacitive resulting signals that include the capacitive effects of the transmitter signals and input object and/or ground.

The processing circuitry is configured to obtain measurements of the capacitive resulting signals and, using the measurements determine positional information and force information. "Positional information" as used herein broadly encompasses absolute position, relative position, velocity, acceleration, and other types of spatial information. "Force information" as used herein broadly encompasses an amount of force applied by the input surface, an amount of displacement of the input surface, or any other indicator of force.

While FIG. 1 shows a configuration of components, other configurations may be used without departing from the scope of the disclosure. For example, various components may be combined to create a single component. As another example, the functionality performed by a single component may be performed by two or more components.

Figure 2:
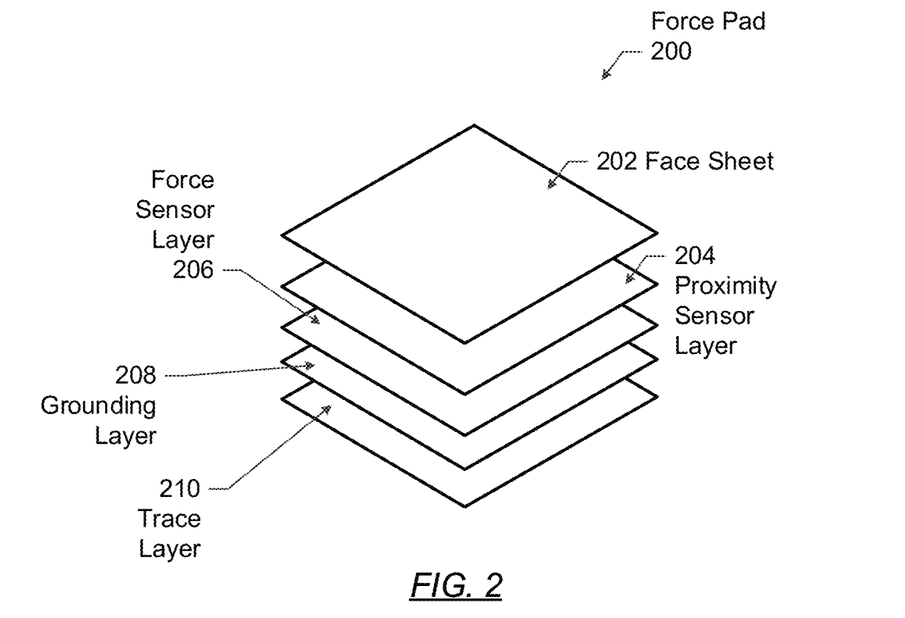
FIG. 2 is an example side perspective diagram of the layers of a force pad in accordance with an embodiment of the disclosure.

FIG. 2 is an example side perspective diagram of a force pad (200) in accordance with an embodiment of the disclosure. As shown in FIG. 2, the force pad (200) includes multiple layers. The layers may be laminated and/or printed layers of material. The various layers are parallel with respect to each other in one or more embodiments. For illustrative purposes, the layers are shown with spacing between the layers. However, the layers are stacked in one or more embodiments. Further, the thickness of each layer may vary between layers without departing from the scope of the invention. For example, some layers may be printed ink while other layers are part of a printed circuit board assembly (PCBA). Additionally, the dimensions and shape of the force pad may vary from shown in the figures without departing from the scope of the disclosure. Any dimension and shape of force pad is contemplated herein. The multiple layers include a face sheet (202), a proximity sensor layer (204), a force sensor layer (206), a grounding layer (208), and a trace layer (210). Each of these layers is described below.

The face sheet (202) is the touch surface of the force pad that may be touched by an input object during operation of the force pad to provide input. Vertically adjacent to the face sheet is a proximity sensor layer (204) in one or more embodiments. The proximity sensor layer (204) includes proximity sensor electrodes. In particular, the proximity sensor electrodes are arranged to detect a presence of an input object in the sensing region. In other words, using the proximity sensor electrodes, the force pad may be configured to detect a location of an input object in the sensing region. By way of an example, the proximity sensor layer may include one or more proximity transmitter electrodes and one or more proximity receiver electrodes, as described above in reference to FIG. 1. A proximity receiver electrode is a receiver electrode used for proximity sensing. A proximity transmitter electrode is a transmitter electrode used for proximity sensing. When the transcapacitance between the proximity transmitter electrodes and the proximity receiver electrodes changes as compared to a baseline, then the input object may be determined to exist at the location of the change. Additionally, or alternatively, the proximity sensor electrodes may be sensor electrodes that are configured to perform absolute capacitive sensing.

A force sensor layer (206) is adjacent to the proximity sensor layer (204). In other words, the proximity sensor layer (204) is interposed between the face sheet (202) and the force sensor layer (206). The force sensor layer (206) may be directly adjacent to the proximity sensor layer (204) or an intermediate layer, such as substrate or insulative material, may exist between the force sensor layer (206) and the proximity sensor layer (204). The force sensor layer (206) is configured to detect force applied to the input surface. In one or more embodiments, the force sensor layer is arranged to perform transcapacitive sensing to detect force. For example, the force sensor layer may include a force transmitter electrode and a force receiver electrode. A force receiver electrode is a receiver electrode used for force sensing. A force transmitter electrode is a transmitter electrode used for force sensing. The force transmitter electrode is configured to transmit sensing signals.

The force transmitter electrode is capacitively coupled to one or more force receiver electrodes. Resulting signals are received via the force receiver electrodes. The resulting signals are from the sensing signals and that are based on the capacitive coupling between the force transmitter electrode and the force receiver electrodes. The resulting signals are further based on an amount of force applied to the input surface. Specifically, when force is applied to the input surface, the capacitive coupling between the force transmitter electrode and the force receiver electrode is changed. The change modifies the resulting signals that are received by the force receiver electrode.

A trace layer (210) connects the sensor electrodes (e.g., force receiver electrodes, the force transmitter electrodes, proximity receiver electrodes, and proximity transmitter electrodes) to the sensor circuitry. Specifically, the trace layer (210) includes traces of electrically conductive material connected to channels of the sensor circuitry. The force transmitter electrode may be electrically connected to the proximity transmitter electrode. For example, an electrical bridge of conductive material may physically connect the force transmitter electrode to the proximity transmitter electrode. In such a scenario, the force transmitter electrode and the proximity transmitter electrode are connected to a same channel via one or more traces. Alternatively, the force transmitter electrode and the force receiver electrode may be separate electrodes that are connected to independent channels.

A grounding layer (208) may be interposed between the force sensor layer (206) and the trace layer (210). The grounding layer (208) is a layer of conductive material that is connected to device ground. The grounding layer (208) shields the force sensor electrodes from the traces. Specifically, in one or more embodiments, the force receiver electrodes may be affected by noise, such as by the tracing layer and any underlying circuitry. The grounding layer (208) shields the force receiver electrodes from the noise.

Figure 3:
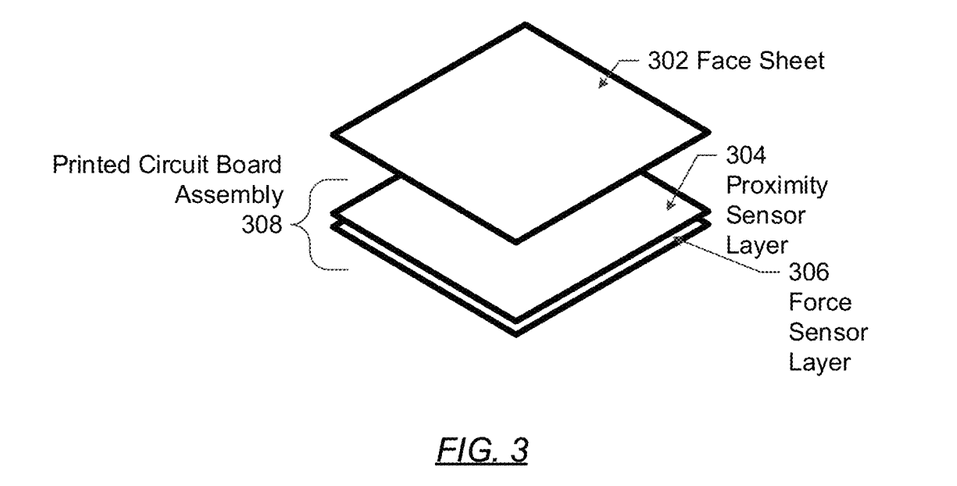
FIG. 3 is an example side perspective diagram of the layers of a force pad in accordance with an embodiment of the disclosure.

FIG. 3 is an example side perspective diagram of the layers of a force pad in accordance with an embodiment of the disclosure. For simplification purposes, the grounding layer and trace layer are not shown in FIG. 3 and may be in a same position as shown in FIG. 2. FIG. 3 shows a face sheet (302) and a printed circuit board assembly (PCBA) (304). In one or more embodiments, the PCBA is a multi-layer PCBA that has the proximity sensor layer (304) on a side of a substrate and a force sensor layer (306) on a side of a substrate, such as the same substrate or a different substrate laminated together. The face sheet (302), proximity sensor layer (304), and force sensor layer (306) may be the same as the face sheet (202), proximity sensor layer (204), and force sensor layer (206), respectively, shown in FIG. 2.

Figure 4:
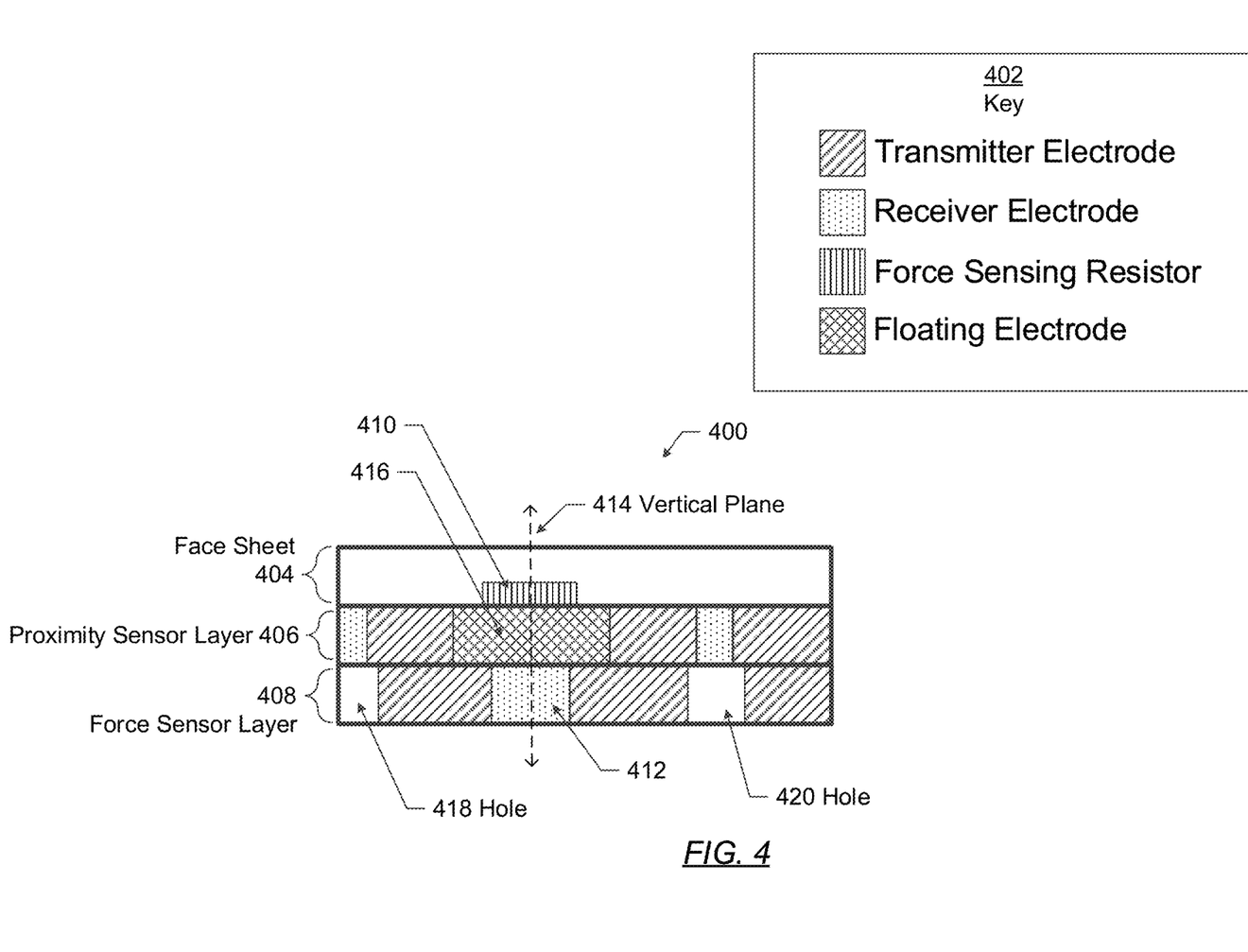
FIG. 4 is a block diagram of a side view of an example force pad in accordance with an embodiment of the disclosure.

FIG. 4 is a block diagram of a side view of an example portion of a force pad sensor (400) and corresponding key (402) in accordance with an embodiment of the disclosure. Specifically, FIG. 4 shows an example of a pixel. The pattern shown in FIG. 4 may be extended across the sensing region. The key (402) is a guide to each of the components shown in force pad sensor according to an embodiment. The size including the length and thickness may vary without departing from the scope of the disclosure. In particular, FIG. 4 shows a vertical layout of sensor electrodes as a cross section view of the force pad sensor (400). For simplifying the figure, the grounding layer and tracing layer are omitted. Thus, the face sheet (404), proximity sensor layer (406), and force sensor layer (408) are shown. The face sheet (302), proximity sensor layer (304), and force sensor layer (306) may be the same or similar to the face sheet (202), proximity sensor layer (204), and force sensor layer (206), respectively, shown in FIG. 2.

In one or more embodiments, the force sensor layer (408) and the proximity sensor layer (406) are each single layers. The use of the term, "single layer", as used herein means that a single two-dimensional horizontal plane may be created that spans the single layer and is touched by each component in the single layer. Additionally, for the term, "single layer", all components are adjacent along the single two-dimensional plane that is parallel to the face sheet. In other words, all components intersect the two-dimensional horizontal plane. Therefore, while the height of the components along the single layer may vary, the components are each adjacent.

The vertical arrangement shows how the force sensor layer (408) may be arranged for force sensing and the proximity sensor layer (406) may arranged to perform proximity sensing. In one or more embodiments, the face sheet (404) includes a force sensing resistor (FSR) (410). An FSR (410) is a material which has a change in resistance when force or pressure is applied to the input surface of the face sheet. Specifically, the FSR (410) may be composed of a conductive polymer. The FSR and the force receiver electrode (412) are vertically arranged to as to intersect a same single vertical plane (414). The single vertical plane (414) extends along a length of the force receiver electrode. The vertical plane (414) is not physical, but rather provides a reference by which the vertical arrangement may be defined. Thus, the FSR (410) is directly above (412) all or a substantial portion of the force receiver electrode (412). In one or more embodiments, the FSR (410) is vertically aligned with the force receiver electrode (412) such that the vertical plane (414) bisects both the FSR (410) and the force receiver electrode (412).

Additionally, as shown, in some embodiments, a floating electrode (416) may be in the proximity sensor layer (406) and be interposed between the FSR (410) and the force receiver electrode (412). A floating electrode (416) is a piece of conductive material that is not physically connected to other conductive material (i.e., not connected to traces). Rather, a floating electrode (416) has insulative material surrounding the floating electrode (416). Thus, the floating electrode is not connected directly or indirectly to a trace. Insulative material exists between the floating electrode (416) and the neighboring transmitter electrodes. The floating electrode (416) is capacitively coupled to the force receiver electrode (412), the force transmitter electrodes on the force sensor layer (408), and the force sensing resistor (410) that intersects the same single vertical plane (414) as the floating electrode (416). By being capacitively coupled to both the force transmitter electrode, the force receiver electrode (412), and the FSR (410), the floating electrode (416) enhances the effects of the FSR (410) on the signal detected by the force receiver electrode (412).

In the force sensor layer (408), the force receiver electrodes are electrodes composed of conductive material that are connected via conductive traces to the processing system. The force receiver electrodes are capacitively coupled to adjacent force transmitter electrodes located on the force sensor layer (408). The capacitive coupling is an intentional coupling to transfer energy from the force transmitter segment to the adjacent force receiver electrode. When force is applied to the touch surface, or input surface of the face sheet (404), the resistance of the FSR (410) changes causing a change in the capacitive coupling between the force receiver electrode and the force transmitter electrode. The change in capacitive coupling is magnified by the floating electrode. Thus, the amount of force may be detected based on signals received by the force receiver electrode.

In the proximity sensor layer (406), proximity receiver electrodes are electrodes composed of conductive material that are connected via conductive traces to the processing system (not shown). The proximity receiver electrodes are capacitively coupled to adjacent proximity transmitter electrodes. The capacitive coupling is an intentional coupling to transfer energy from the proximity transmitter electrode to the adjacent proximity receiver electrode. The vertical relationship between the proximity receiver electrode as compared to FSR and the floating electrode minimizes the effects of the change in resistance by the FSR on the capacitive coupling. Additionally, in one or more embodiments, one or more holes (418, 420) exists in force transmitter electrode. The one or more holes are vertically aligned with the proximity receiver electrode. For example, the vertical alignment may be vertically center aligned. The one or more holes minimize the capacitive coupling between the proximity receiver electrode and the force transmitter electrode. In one or more embodiments, the holes (418, 420) may completely separate portions of the force transmitter electrode to create separate electrodes. The holes (418, 420) may include airgap or other insulative material.

Figure 5:
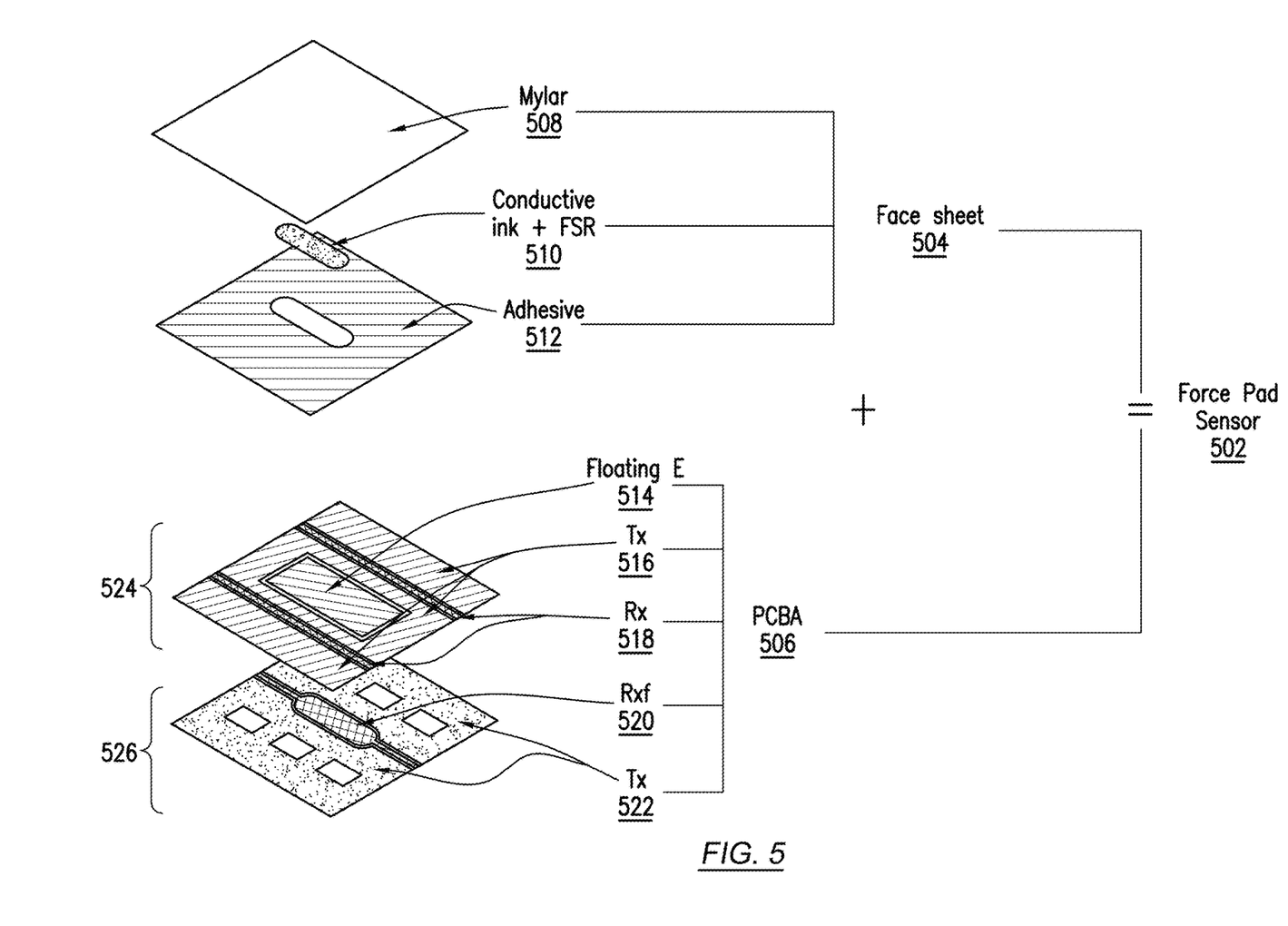
FIG. 5 is an example side perspective diagram of the layers of an example force pad in accordance with an embodiment of the disclosure.
Figure 6:
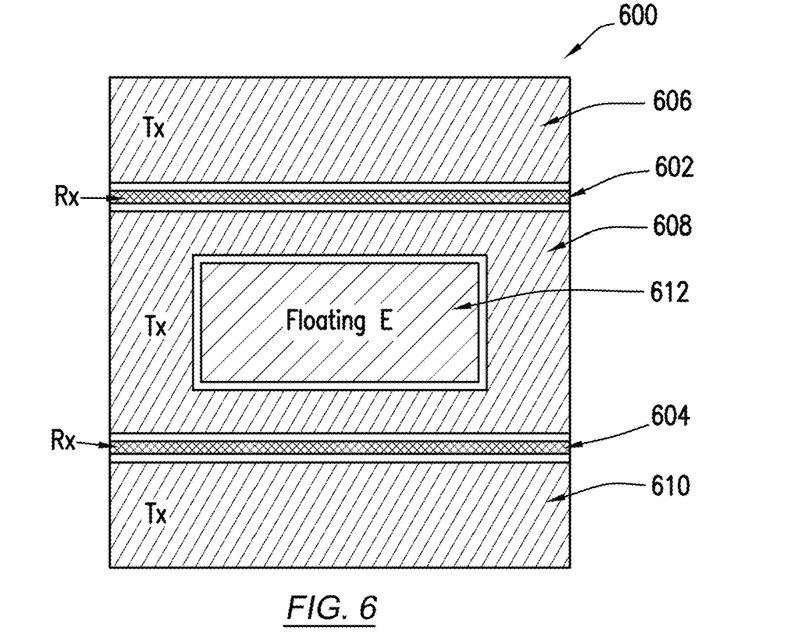
FIG. 6 is a top down view diagram of a portion of the proximity sensor layer in accordance with an embodiment of the disclosure.
Figure 7:
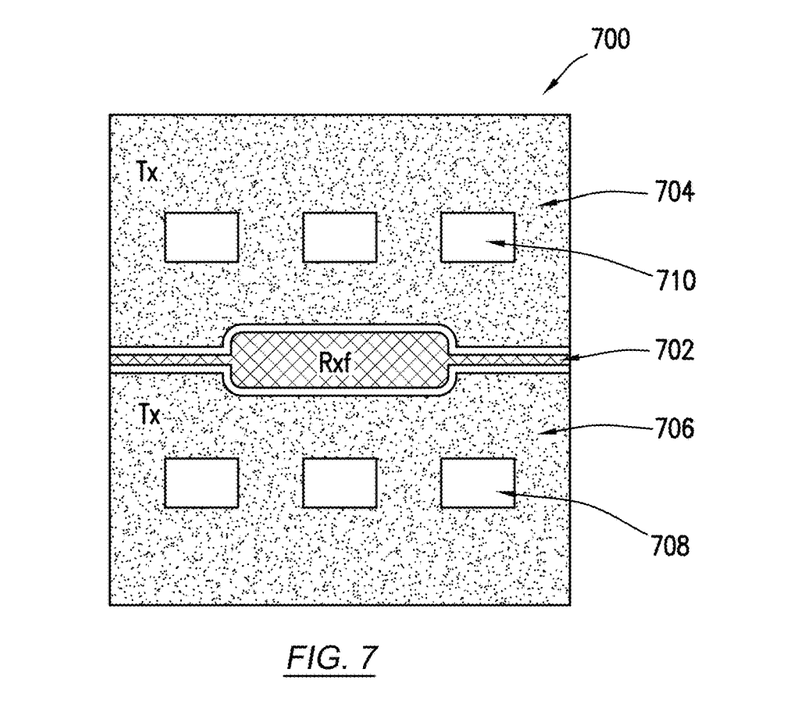
FIG. 7 is a top down view diagram of a portion of the force sensor layer in accordance with an embodiment of the disclosure.

FIG. 4 shows a vertical arrangement of sensor electrodes. Various horizontal arrangements may exist that achieve the vertical arrangement. FIGS. 5-7 show an example of a horizontal arrangement of sensor electrodes. Specifically, FIGS. 5-7 show an example sensing pixel. The sensing pixel of FIGS. 5-7 may extend across the sensing region. FIG. 5 is an example side perspective diagram of the layers of an example force pad in accordance with an embodiment of the disclosure.

As shown in FIG. 5, the force pad sensor (502) includes a face sheet (504) and PCBA (506). The face sheet (504) includes a mylar layer (508) that provides a touch surface (i.e., input surface) which input objects may touch. Disposed underneath the mylar layer (510) is a conductive ink and FSR (510) layer. The conductive ink and FSR (510) may be connected via an adhesive (512) to the PCBA (508). The FSR (510) is the same or similar to the FSR in FIG. 4. The conductive ink protects the FSR (510) from continual stresses applied.

The PCBA (506) includes a proximity sensor layer (524) and a force sensor layer (528). The proximity sensor layer (524) includes a floating electrode (514), a proximity transmitter electrode (516), and a proximity receiver electrode (518). The force sensor layer (526) includes a force receiver electrode (520) and a force transmitter electrode (522). The arrangement of the FSR (510), and the various sensor electrodes in FIG. 5 is an example of an arrangement that achieves the vertical arrangement of FIG. 4. For example, as shown, in the pixel, six holes in the force transmitter electrode (522) are vertically aligned with the proximity receiver electrode (518). The holes are vertically aligned with a substantial portion of the proximity receiver electrode (5180) to reduce the effects of the force transmitter electrode (522). For example, the substantial portion may be an amount more than 75%.

FIG. 6 is a top down view diagram of a portion of the proximity sensor layer (600) in accordance with an embodiment of the disclosure. As shown in FIG. 6, the proximity sensor layer (600) may include parallel proximity receiver electrodes (602, 604) and parallel proximity transmitter electrodes (606, 608, 610). The proximity receiver electrode is interposed between two proximity transmitter electrodes. In other words, the proximity receiver electrode is capacitively coupled to the two proximity transmitter electrodes. The floating electrode (612) is located within a single proximity transmitter electrode (608). As shown, the floating electrode is not electrically, physically connected to the proximity transmitter electrode (608). Insulative material may be between the floating electrode and the proximity transmitter electrode (608).

FIG. 7 is a top down view diagram of a portion of the force sensor layer (700) in accordance with an embodiment of the disclosure. A force receiver electrode (702) is adjacent to force transmitter electrodes (704, 706). The force receiver electrode (702) and force transmitter electrodes (704, 706) are adjacent. The force transmitter electrode (704, 706) include holes (708, 710). The holes (708, 710) are substantially aligned with the proximity receiver electrode.

Figure 8:
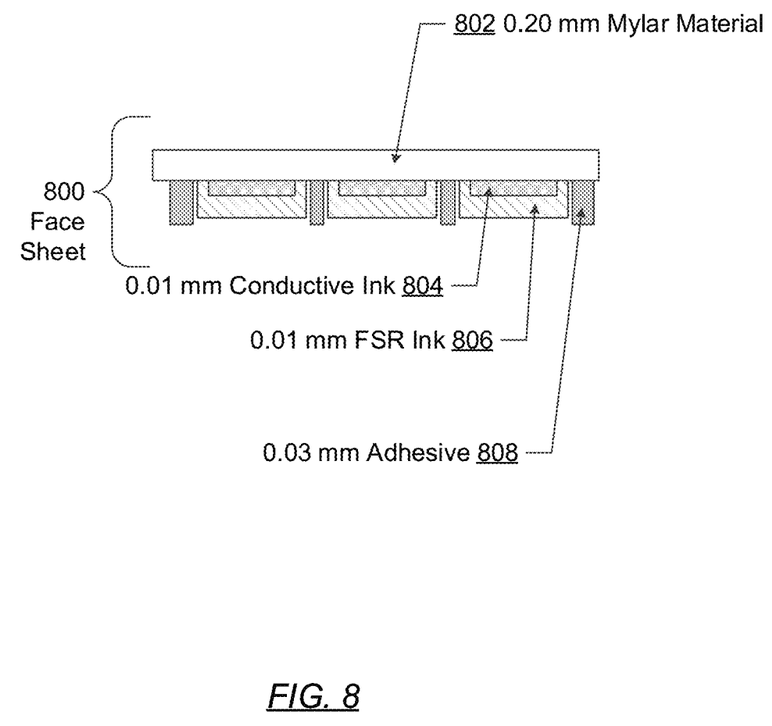
FIG. 8 is a side view of an example face sheet in accordance with an embodiment of the disclosure.

FIG. 8 is a side view of an example face sheet (800) in accordance with an embodiment of the disclosure. In particular, FIG. 8 shows an example layering of the face sheet (800). In the example, the face sheet (800) includes a 0.20 millimeter (mm) mylar material (802) sheet. A 0.01 mm conductive ink (804) may be printed on the mylar material (802). For example, the conductive ink may be conductive ink. 0.01 FSR ink (806) is printed on the conductive ink (804) and the mylar material (802). A 0.03 mm adhesive (808) is configured to attach the face sheet to the PCBA (not shown). For example, the adhesive (808) may be 3M8003 material.

Figure 9:
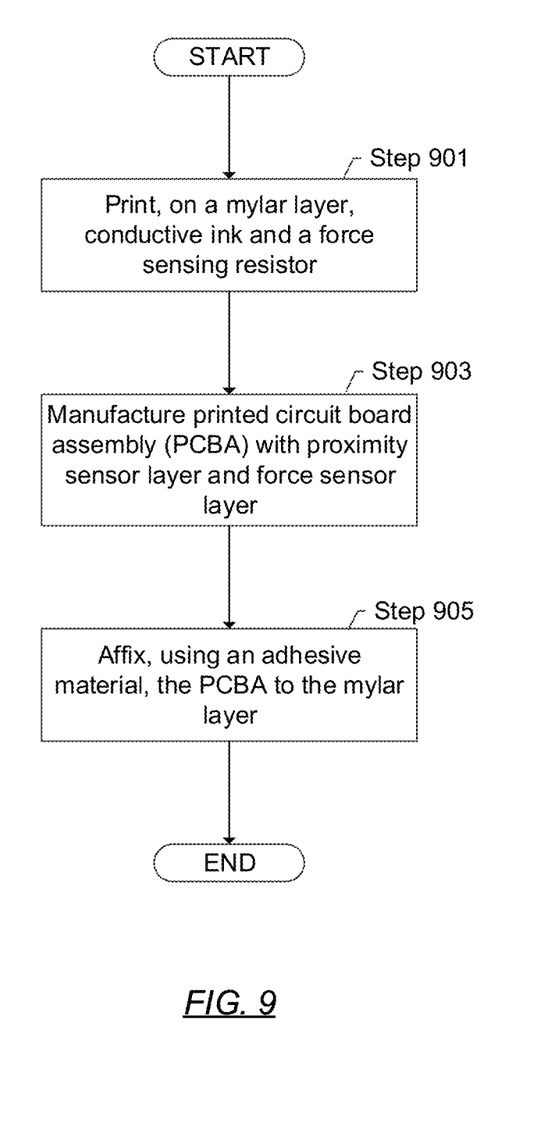
FIG. 9 is a flowchart for manufacturing a force pad in accordance with one or more embodiments of the disclosure.

FIG. 9 is a flowchart for manufacturing a force pad in accordance with one or more embodiments of the disclosure. In Block 902, on a mylar layer, conductive ink and FSR ink are printed on a mylar layer. For example, conductive ink may be printed in the pattern followed by printing the FSR ink.

In Block 903, a PCBA assembly is manufactured. The PCBA includes a first layer of the proximity sensor layer and another layer of a force sensor layer. In particular, the pattern of the proximity sensor layer may be printed on the substrate. The pattern of the force sensor layer may also be printed on the same substrate, such as a different side, or on a different substrate. One or more substrates may be laminated together.

In Block 905, using an adhesive material, the PCBA is affixed to the mylar layer. A grounding layer may be printed underneath the PCBA or otherwise affixed to the PCBA. Further, the tracing layer may also be printed or affixed to the PCBA. Insulative material may be interposed between the grounding layer and the tracing layer. Holes in the insulative material may be used to connect the electrodes to the traces. The traces may be connected to the input and output channels of the sensor circuitry of the processing system.

Thus, the embodiments and examples set forth herein were presented in order to best explain various embodiments and the particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed.

What is claimed is:

1. A force pad sensor comprising:
 a face sheet comprising a force sensing resistor (FSR); and
 a printed circuit board assembly comprising:
  a proximity sensor layer comprising a proximity receiver electrode and a proximity transmitter electrode; and
  a force sensor layer comprising a force receiver electrode and a force transmitter electrode,
 wherein the force receiver electrode and the FSR intersect a same vertical plane, the vertical plane being perpendicular to the face sheet.

2. The force pad sensor of claim 1, wherein the proximity sensor layer comprises a floating electrode, the floating electrode intersecting the same vertical plane.

3. The force pad sensor of claim 1, wherein the force transmitter electrode comprises a plurality of holes vertically aligned with a substantial portion of the proximity receiver electrode.

4. The force pad sensor of claim 1, wherein the proximity receiver electrode is interposed between two proximity transmitter electrodes, wherein the floating electrode is located within one of the two proximity transmitter electrodes.

5. The force pad sensor of claim 4, wherein the floating electrode shields the force receiver electrode from the proximity transmitter electrode.

6. The force pad sensor of claim 1, further comprising:
 a mylar layer, and
 conductive ink and the FSR printed on the mylar layer.

7. The force pad sensor of claim 6, wherein the face sheet further comprises the mylar layer and the conductive ink.

8. The force pad sensor of claim 6, wherein the conductive ink comprises a first portion of conductive ink and a second portion of conductive ink, and wherein the FSR is interposed between the first portion and the second portion.

9. The force pad sensor of claim 6, further comprising:
 an adhesive surrounding the FSR and connecting the face sheet to the printed circuit board assembly.

10. The force pad sensor of claim 1, wherein the force transmitter electrode and the proximity transmitter electrode are electrically coupled.

11. A force pad comprising:
 a face sheet comprising:
  a mylar layer, and
  conductive ink and a force sensing resistor printed on the mylar layer;
 a proximity sensor layer comprising a proximity receiver electrode, a proximity transmitter electrode, and a floating electrode; and
 a force sensor layer comprising a force receiver electrode and a force transmitter electrode,
 wherein the force receiver electrode, the FSR, and the floating electrode intersect a same vertical plane, the same vertical plane being perpendicular to the face sheet.

12. The force pad of claim 11, further comprising:
 a grounding layer,
 wherein the proximity sensor layer and the force sensor layer are disposed between the face sheet and the grounding layer.

13. The force pad of claim 11, further comprising:
a trace routing layer,
wherein the proximity sensor layer and the force sensor layer are disposed between the face sheet and the trace routing layer.

14. The force pad of claim 11, wherein the force transmitter electrode comprises a plurality of holes vertically aligned with a substantial portion of the proximity receiver electrode.

15. The force pad of claim 11, wherein the proximity receiver electrode is interposed between two proximity transmitter electrodes, wherein the floating electrode is located within one of the two proximity transmitter electrodes.

16. The force pad of claim 11, wherein the floating electrode shields the force receiver electrode from the proximity transmitter electrode.

17. The force pad of claim 11, wherein the conductive ink comprises a first portion of conductive ink and a second portion of conductive ink, and wherein the FSR is interposed between the first portion and the second portion.

18. The force pad of claim 11, further comprising:
a printed circuit board assembly comprising the proximity sensor layer and the force sensor layer; and
an adhesive surrounding the FSR and connecting the face sheet to the printed circuit board assembly.

19. The force pad of claim 11, wherein the force transmitter electrode and the proximity transmitter electrode are electrically coupled.

20. A method comprising:
printing, on a mylar layer, conductive ink and a force sensing resistor (FSR); and
affixing, using an adhesive material, a printed circuit board assembly to the mylar layer, the printed circuit board assembly comprising:
a proximity sensor layer comprising a proximity receiver electrode and a proximity transmitter electrode, and
a force sensor layer comprising a force receiver electrode and a transmitter electrode,
wherein the force receiver electrode and the FSR intersect a same vertical plane, the same vertical plane being perpendicular to the face sheet.

* * * * *